United States Patent [19]
Ong

[11] 3,980,955
[45] Sept. 14, 1976

[54] CONTROL DEVICE

[75] Inventor: Kian Kie Ong, Eindhoven, Netherlands

[73] Assignee: U.S. Philips Corporation, New York, N.Y.

[22] Filed: Apr. 3, 1975

[21] Appl. No.: 564,790

[30] Foreign Application Priority Data
Apr. 19, 1974 Netherlands .................. 7405304

[52] U.S. Cl. .................. 325/390; 340/147 MT; 340/168 R
[51] Int. Cl.² ..................................... H03K 25/00
[58] Field of Search ..... 340/147 MT, 167 R, 168 R; 328/50, 51; 325/390, 392, 464, 465; 178/DIG. 15; 334/15; 235/151

[56] References Cited
UNITED STATES PATENTS

| | | | |
|---|---|---|---|
| 3,614,666 | 10/1971 | Ribour et al. | 333/15 X |
| 3,748,645 | 7/1973 | Kawashima | 340/168 R |
| 3,811,090 | 5/1974 | Uchida et al. | 325/392 X |

*Primary Examiner*—Benedict V. Safourek
*Attorney, Agent, or Firm*—Frank R. Trifari; Henry I. Steckler

[57] ABSTRACT

For simultaneous correction of all function adjustments of, for example, a television receiver, adjustable correcting information is stored by means of a normal function control members in a memory which is read out on operation of a function correction member.

2 Claims, 1 Drawing Figure

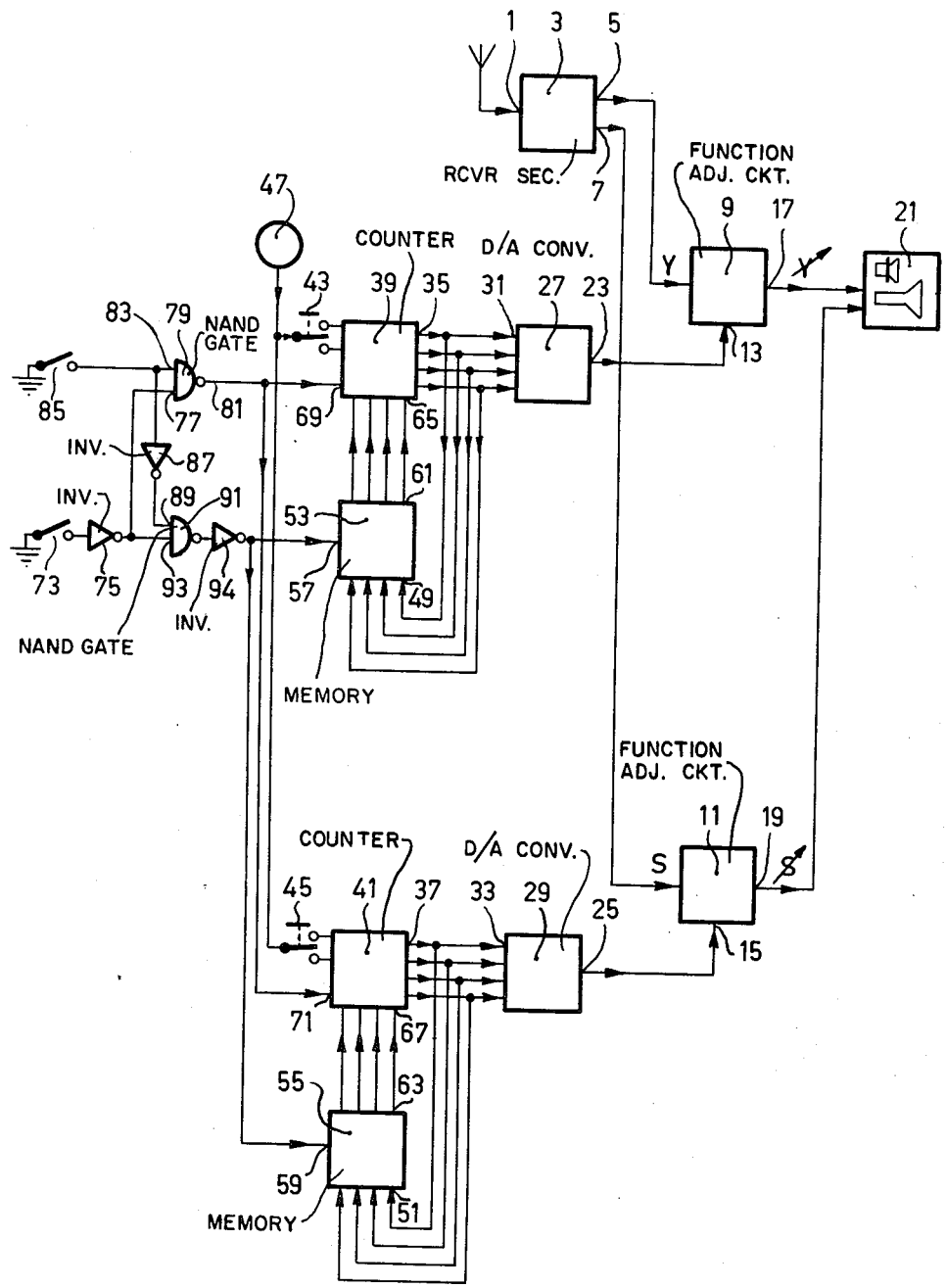

CONTROL DEVICE

The invention relates to a control device for adjusting at least one function of, for example, a receiver or an amplifier, which device comprises a counter and a digital-to-analog converter which is coupled to outputs of the counter and an output of which is coupled to an adjusting signal input of a function adjusting circuit, the counter being capable of being immediately set to a desired position by a control correction member.

In the German periodical "Funkschau," 1972, No. 23, pages 855–857, and No. 24, pages 903–904, a control device of the afore-mentioned type is described in which the counter can be set by the control correction member to a count which corresponds to one half of the maximum value to be counted. The transfer factor of the function adjusting circuit (for example a circuit for adjusting volume, brightness, contrast or saturation) then must be set to an average value. However, it was found that owing to differences between the function adjusting circuits this is not the case, so that the average value settings of different receivers of amplifiers may show large differences.

It is an object of the present invention to provide a step for avoiding this disadvantage.

For this purpose, a control device of the aforementioned type according to the invention is characterized in that the digital setting value for the said desired count is supplied from a memory which information can be written by the counter by means of a write-in control member.

This enables an arbitrary counter state which can be set by the usually available function control members and is associated with a desired function adjustment to be written in the memory so that differences in transfer factors can be corrected by the said control members without an additional adjusting possibility being required for each function.

A control device according to the invention furthermore has the advantage that a value which corresponds to the taste of the person who operates the receiver or amplifier by means of the said control device can simply be written in the memory.

The invention will now be described more fully with reference to the drawing which comprises a single FIGURE.

The FIG. is a simplified block-schematic diagram of a television receiver provided with a control device according to the invention.

Referring now to the Figure, a received television signal is applied to an input 1 of a receiver section 3. As a result, a brightness signal Y and a sound signal S are produced at outputs 5 and 7 respectively and applied to function adjusting circuits 9 and 11 respectively. To adjusting signal inputs 13 and 15 respectively of the function adjusting circuits adjusting signals are applied which each determine the transfer factor of the relevant adjusting circuit so that from outputs 17 and 19 of the adjusting circuits 9 and 11 respectively signals having a desired amplitude are obtainable which are applied to a reproducing device 21.

The adjusting signals at the inputs 13 and 15 are derived from outputs 23 and 25 respectively, of digital-to-analog converters 27 and 29 respectively which each have a group of inputs 31 and 33 respectively which are connected to groups of corresponding outputs 35 and 37 respectively of counters 39 and 41 respectively.

The states of the counters 39 and 41 can be set by function control members 43 and 45 respectively by means of which counting pulses from a clock generator 47 can be supplied to an up-counting or down-counting input of the relevant counter until it has set a desired function value via the digital-to-analog converter.

The groups of outputs 35 and 37 of the counters 39 and 41 respectively are also connected to corresponding groups of inputs 49 and 51 of memory circuits 53 and 55 respectively at which counter output signals appear which can be written in the memories 53 and 55 by means of write-in signals applied to write-in signal inputs 57 and 59 respectively. The generation of the write-in signal will be described hereinafter.

The memories 53 and 55 have groups of outputs 61 and 63 respectively which are connected to groups of inputs 65 and 67 of the counters 39 and 41 respectively. The signals applied to the groups of inputs 65 and 67 by the memories 53 and 55 respectively can be written in the relevant counter if a write-in signal is applied to a write-in signal input 69 or 71 of the counter 39 or 41 respectively. The generation of this signal also will be described hereinafter.

Thus in each memory 53 and 55 an arbitrarily adjustable setting can be stored which at any desired instant can immediately set the state of the counter 39 or 41 respectively to a desired value.

The latter operation can be performed by means of a control correcting member 73. An input of an inverter circuit 75 then is set to logical 0 and its output to logical 1, so that an input 77 of a NAND-gate 79 is at 1 and its output 81 at 0, because in the inoperative condition of a write-in control member 85 a logical 1 is applied to another input 83 also. The adjustment information stored in the memory 53, 55 then is set in the counter 39, 41 respectively. The counter 39 must be designed so that logical 0 at the input 69 sets the counter to the desired state. The counter may, for example, be of the type SN 74193.

To write information in the stores 53 and 55 the control correction member 73 must be operated simultaneously with the write-in control member 85. In this case a logical zero is applied to an input of an inverter circuit 87 so that at an input 89 of a second NAND-gate circuit 91 a logical 1 appears. At the output of the inverter circuit 75 a logical 1 appears also, so that a logical 1 is applied to a further input 93 of the second gate 91 and hence a logical 0 appears at its output, causing an inverter circuit 94 to be driven so that a logical 1 appears at its output, thus applying a write-in signal to the inputs 57 and 59. The memory 53, 55 then must be of a type in which on application of a logical 1 to its input 57, 59 respectively information is written, for example of the type SN 7475.

The condition of simultaneous operation of two members 85, 73 obviously is not necessary, but has been chosen to prevent that accidental touching of the write-in control member 85 should cause information to be written in the memories at an undesirable instant, as may be the case if the circuit were such that operation of the control member 73 could be dispensed with when writing in the memories.

It will be clear that instead of a television receiver, for example, a radio receiver or an amplifier may be provided with a control device according to the invention.

The control device may simply be designed for both local and remote control.

The advantage of the absence of additional function adjustment correction members increases in accordance with increase in the number of functions which can simultaneously be adjusted by the control correcting member 73.

Any smaller or larger number of functions may be controlled in the manner described.

Obviously counters and memories may be used which are more extensive or of other types than those described.

What is claimed is:

1. Control device for adjusting at least one function, which device comprises a counter having a plurality of outputs, a digital-to-analog converter coupled to said outputs of the counter and having an output, a function adjustment circuit having an adjusting signal input coupled to said converter output, a control correction member means for immediately setting said counter into a selected state, a memory means coupled to said counter outputs for supplying the digital setting for said desired state, and a write-in control member means for providing that information from said counter outputs is written into said memory.

2. Control device as claimed in claim 1, further comprising a pair of gate circuits each having a pair of inputs respectively coupled to the said control members and an output respectively coupled to said counter and said memory, wherein for writing information in the memory the said two control members must be operated simultaneously, and wherein for setting the counter to the desired state the control correction member alone need be operated.

* * * * *